(12) United States Patent
Fahrenbruch

(10) Patent No.: US 6,282,253 B1
(45) Date of Patent: Aug. 28, 2001

(54) POST-FILTERED RECIRCULATING DELAY-LOCKED LOOP AND METHOD FOR PRODUCING A CLOCK SIGNAL

(75) Inventor: Shawn A. Fahrenbruch, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/991,270

(22) Filed: Dec. 16, 1997

(51) Int. Cl.[7] ........................................................ H04L 7/00
(52) U.S. Cl. .................... 375/371; 375/375; 375/376; 327/156; 327/158; 327/553
(58) Field of Search ...................... 375/371, 375, 375/376, 362; 360/51, 67; 327/158, 553, 161, 156, 261; 365/233

(56) References Cited

U.S. PATENT DOCUMENTS

| | | | |
|---|---|---|---|
| 5,345,119 | * 9/1994 | Khoury | 327/553 |
| 5,646,564 | * 7/1997 | Erickson et al. | 327/158 |
| 5,727,037 | * 3/1998 | Maneatis | 375/376 |
| 5,790,612 | * 8/1998 | Chengson et al. | 375/375 |
| 5,796,673 | * 8/1998 | Foss et al. | 365/233 |

OTHER PUBLICATIONS

Michel Combes et al., A Portable Clock Multiplier Generator Using Digital CMOS Standard, IEEE, Journal of Solid-State Circuits, vol. 31, No. 7, pp. 958–965, Jul. 1996.*

* cited by examiner

Primary Examiner—Stephen Chin
Assistant Examiner—Shuwang Liu
(74) Attorney, Agent, or Firm—W. Daniel Swayze, Jr.; W. James Brady; Frederick J. Telecky, Jr.

(57) ABSTRACT

An apparatus for producing a clock signal includes a recirculating delay-locked loop operable to receive a reference clock signal, produce an output clock signal, and adjust the relative phase, with respect to the reference clock signal, of the output clock signal to align the output clock signal with the reference clock signal. The apparatus also includes a phase filter that is operable to receive the output clock signal and filter any phase shift of the output clock signal over a plurality of cycles of the output clock to produce an adjusted output clock signal.

24 Claims, 7 Drawing Sheets

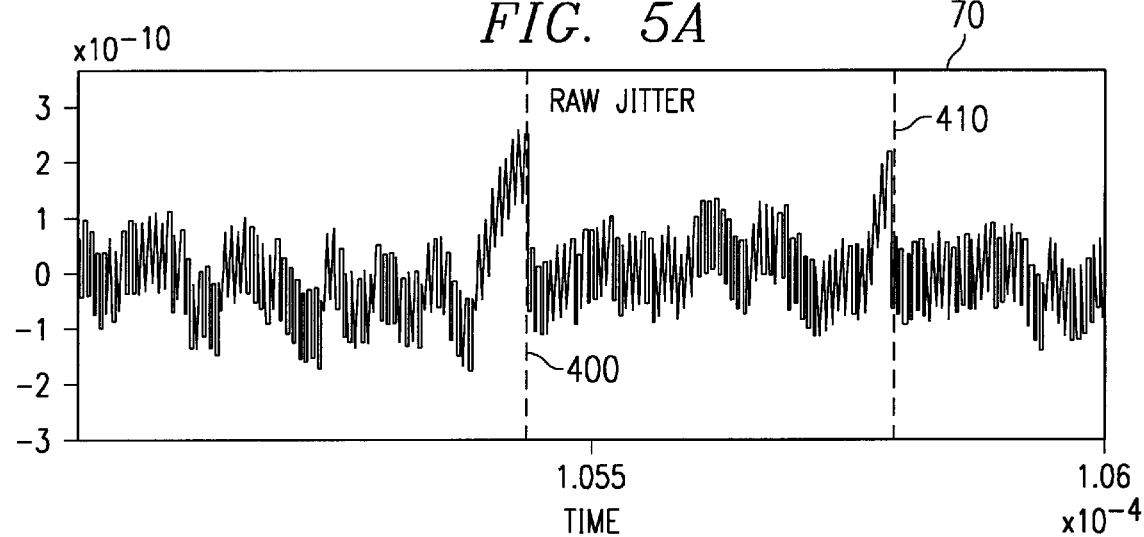
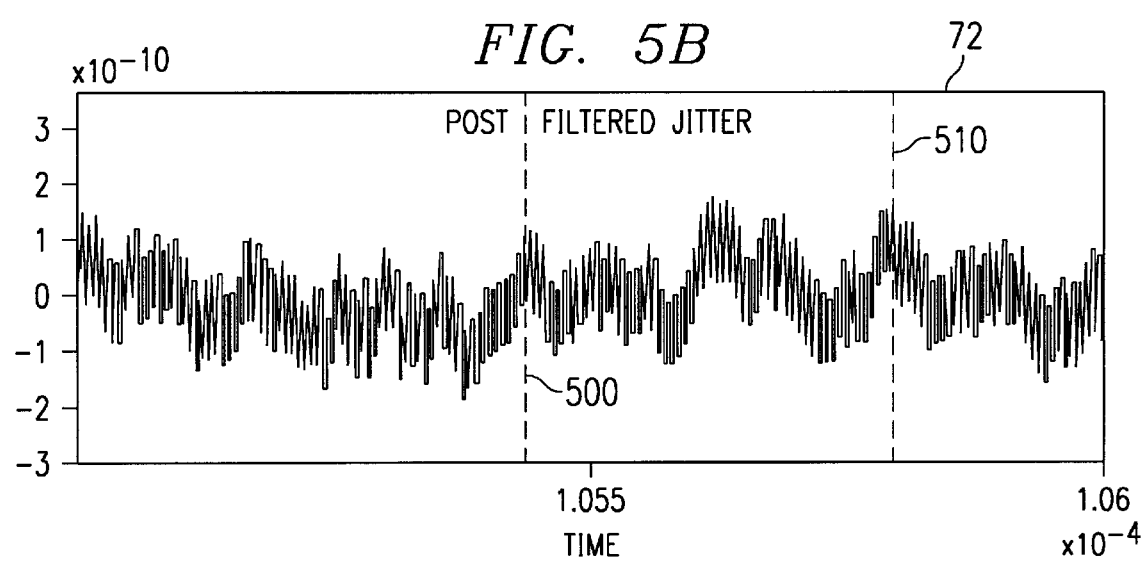

POST-FILTERED RECIRCULATING DELAY-LOCKED LOOP AND METHOD FOR PRODUCING A CLOCK SIGNAL

TECHNICAL FIELD OF THE INVENTION

This invention relates in general to the field of electronic circuitry and more particularly to a post-filtered recirculating delay-locked loop and method of operation.

BACKGROUND OF THE INVENTION

A recirculating delay-locked loop (DLL) is becoming the system of choice for frequency synthesis where the output frequency is one to twenty times the input frequency. The recirculating delay-locked loop is more desirable than a traditional phase locked loop (PLL) because it provides a first order feedback system as opposed to the typical third or fourth order nature of a phase locked loop. In addition, a recirculating delay-locked loop has better long-term phase noise performance in comparison to a traditional phase locked loop. Furthermore, a delay-locked loop is easy to implement with a digital control that does not require a loop filter. An example recirculating delay-locked loop is described in *A Portable Clock Multiplier Generator Using Digital CMOS Standard Cells*, Michel Combes, Karim Dioury, and Alain Greiner, IEEE Journal of Solid-State Circuits, Vol. 31 No. 7, July, 1996.

A recirculating delay-locked loop utilizes a set of delay elements. The delay elements are adjusted to delay an output clock signal such that the output clock signal has a rising edge coincident with the rising edge of an input clock signal. By providing such delay mechanisms, the input and output clock signals are "locked" into phase with each other. Until an appropriate delay time is automatically determined by the recirculating delay-locked loop for a given input clock signal and output clock signal, any misalignment of phase of the input clock signal and the output clock signal is eliminated by aligning the rising edge of the output clock signal with the rising edge oof the input clock signal once for each clock signal of the input clock.

SUMMARY OF THE INVENTION

The present invention recognizes that a recirculating delay-lock loop may suffer phase discontinuities. The present invention recognizes that a recirculating delay-locked loop can have worse short term, or cycle-to-cycle, phase noise performance in comparison to a phase locked loop because, when an input clock signal and the output clock signal are not "locked," all phase noise is completely corrected in one cycle of the output clock upon comparison with the input clock. This correction may be referred to as refreshing the phase of the recirculating delay-locked loop. This phase correction occurs once every M cycles, where M is an integer multiple representing the ratio of the frequency of the output clock to the input clock. Correcting this error in one cycle of the output clock can result in an unacceptably large phase discontinuity.

From the foregoing it may be appreciated that a need has arisen for a post-filtered recirculating delay-locked loop and method of operation that eliminates or reduces the problems associated with prior systems. In accordance with the present invention, a post-filtered recirculating delay-locked loop and method of operation are provided that substantially eliminate the disadvantages and problems previously outlined. The present invention utilizes an infinite impulse response filter for smoothing phase discontinuities that occur when a recirculating delay-locked loop refreshes its phase.

According to the present invention, a method for generating a clock signal comprises the steps of receiving a clock signal from a recirculating delay-locked loop, in filtering a periodic output signal from the recirculating delay-locked loop such that any phase shift in the output signal of the recirculating delay-locked loop is spread over a calculated number of periods of the output clock signal to produce a filtered output signal.

According to another aspect of the present invention, an apparatus for producing a clock signal includes a recirculating delay-locked loop operable to receive a reference clock signal, produce an output clock signal, and adjust the relative phase, with respect to the reference clock signal, of the output clock signal to align the output clock signal with the reference clock signal. The apparatus also includes a phase filter that is operable to receive the output clock signal and filter any phase shift of the output clock signal over a plurality of cycles of the output clock to produce an adjusted output clock signal.

The present invention provides a myriad of technical advantages. A post-filtered recirculating delay-locked loop smooths out short term phase discontinuities without giving up the benefit of long term phase performance associated with a recirculating delay-locked loop. The post filtered recirculating delay-locked loop complements the advantages of a first order DLL with a first order infinite impulse response (IIR) post filter (lowpass). The overall behavior of the system remains first order because, according to one embodiment, the output of the filter is not fed back into the recirculating delay-locked loop.

An added advantage of the invention is that it has low bandwidth of reference noise provided that the reference noise is bounded to plus or minus one quarter of an oscillator period while maintaining an effective high bandwidth to noise generated in the loop itself. These two conflicting constraints are conventionally at odds in a traditional PLL. Further, the invention provides noise immunity to the recirculating delay-locked loop, which would otherwise have no noise immunity from a reference clock. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which:

FIG. 5 is a graph of phase error versus time illustrating the effect of changing the amount of feedback in the infinite impulse response filters of FIGS. 2B and 2C;

DETAILED DESCRIPTION OF THE INVENTION

Embodiments of the present invention and their advantages are best understood by referring to FIG. 1–7 of the drawings, like numerals being used for like and corresponding parts of the various drawings.

Figure 1:
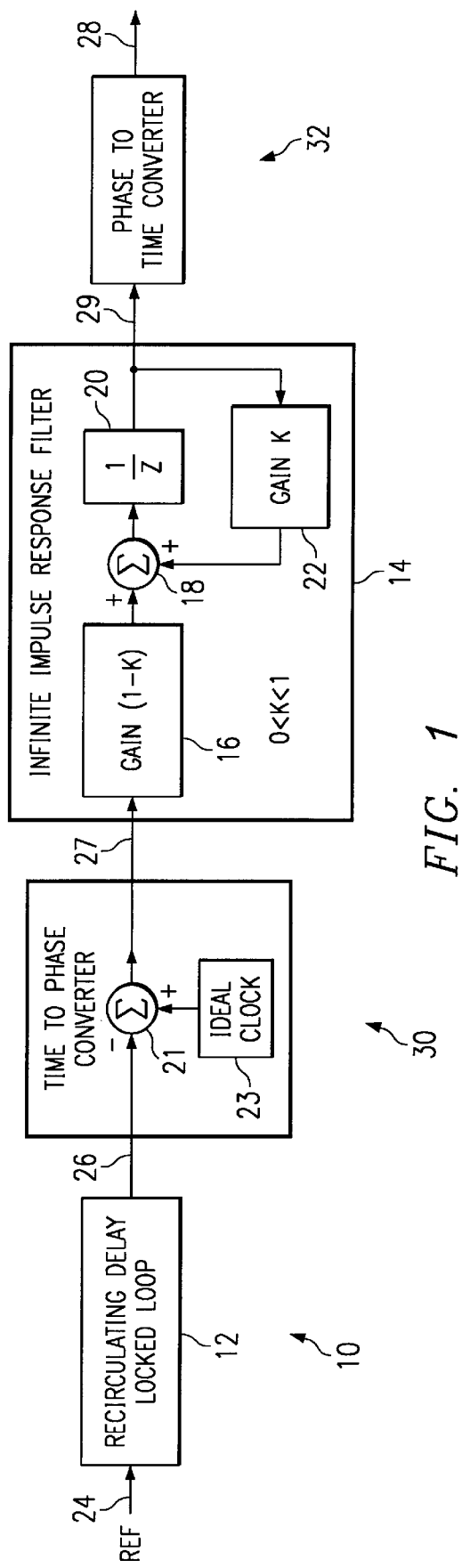
FIG. 1 is a block diagram illustrating the concept of a post-filtered recirculating delay-locked loop according to the teachings of the present invention.

FIG. 1 is a block diagram illustrating the concept of a post-filtered recirculating delay-locked loop according to the teachings of the present invention. Post-filtered recirculating delay-locked loop 10 includes a recirculating delay-locked loop 12 and an infinite impulse response filter 14. An example of a recirculating delay-locked loop 12 may be found in *A Portable Clock Multiplier Generator Using Digital CMOS Standard Cells*, Michel Combes, Karim Dioury, and Alain Greiner, IEEE Journal of Solid-State Circuits, Vol. 31, No. 7, July 1996, which is incorporated herein by reference.

Recirculating delay-locked loop 10 receives a reference clock signal 24 and produces an output clock signal 26. Output clock signal 26 is typically an integer multiple of reference clock signal 24. Recirculating delay-locked loop 12 performs the function of multiplying reference signal 24 by a given integer and, in addition, aligns the phases of reference clock 24 and output clock 26. Recirculating delay-locked loop 12 aligns the phases of reference clock signal 24 and output clock signal 26 by adjusting delay elements in recirculating delay-locked loop until output clock signal 26 lags reference clock signal 24 by exactly one period. However, until the appropriate delay of the delay elements is determined, recirculating delay-locked loop 12 measures the phase difference between reference clock signal 24 and output clock signal 26 and delays output clock signal 26 once per clock cycle of reference clock signal 24 such that the rising edge of both clocks are coincident once per cycle of reference clock signal 24. Because of this method of operation of recirculating delay-locked loop 12, the alignment of phases effected by recirculating delay-locked loop 12 by aligning the rising edges of each clock signal once per clock cycle of reference clock signal 24 causes a phase discontinuity in output clock signal 26, which could cause an error in a system utilizing output clock signal 26. The combination of infinite impulse response filter 14 with recirculating delay-locked loop 12 helps reduce the effects of such phase discontinuities.

Infinite impulse response filter receives an input phase signal 27 and generates a phase output signal 29. The generation of input phase signal 27 from output clock signal 26 and output clock signal 28 from output phase signal 29 is described in detail below after the description of infinite impulse response filter 14. As described in greater detail below, phase output signal 29 provides a more gradual phase adjustment of an output clock signal 28 than does output clock signal 26. Input phase signal 27 of recirculating delay-locked loop 12 is multiplied by gain system 16. The gain provided by gain system 16 is equal to 1-K, where K is between zero and one. The output of gain system 16 is provided to a summing unit 18. A second input to summing unit 18 is provided by gain system 22. The gain of gain system 22 is equal to K, where K is between zero and one. The input to gain system 22 is a feedback signal from output phase signal 29. The output of summing unit 18 is provided to a delay unit 20. Delay unit 20 delays its input for a time period equal to the period of output clock signals 26 and 28. The below table illustrates the effect of infinite impulse response filter 14 on a step change at time t=2 from 0 to 1 of input phase signal 27 on output phase signal 29. In the below table, a value of 0.75 is chosen for K.

| Time | Input Phase Signal 27 | Output Phase Signal 29 |
| --- | --- | --- |
| 0 | 0 | 0 |
| 1 | 0 | 0 |
| 2 | 1 | 0.25 |
| 3 | 1 | 0.25 + 0.75 × 0.25 = 0.44 |
| 4 | 1 | 0.25 + 0.75 (0.25 + 0.75 × 0.25) = 0.25 + 0.75 × 0.44 = 0.58 |
| 5 | 1 | 0.25 + 0.75 [0.25 + 0.75 × (0.25 + 0.75 × 0.25)] = 0.25 + 0.75 × 0.58 = 0.68 |
| 6 | 1 | 0.25 + 0.75 {0.25 + 0.75 [0.25 + 0.75 × (0.25 + 0.75 × 0.25)]} = 0.25 + 0.75 × 0.68 = 0.76 |
| 16 | 1 | 0.99 |

Infinite impulse response filter 14 produces an output phase signal 29 at time t that is equal to (1-K)×(input phase signal 27)+K×(output phase signal 29 at time t−1)=0.25+ 0.75×(output phase signal 29 at time t−1). As illustrated, as input phase signal 27 transitions from zero to one, infinite impulse response filter provides a output phase signal 29 that gradually changes from zero to one. This gradual change is desirable because it smooths out short term phase discontinuities that result from recirculating delay-locked loop 12.

As described above, recirculating delay-locked loop 12 produces an output clock signal 26, and infinite impulse response filter 14 receives a phase input signal 27. Phase input signal 27 is generated from output clock signal 26 by a time-to-phase converter 30. Time-to-phase converter 30 includes a summing unit 21 and an ideal clock 23. Ideal clock 23 produces a clock signal having the same frequency as output clock signal 26 and that is not subject to phase discontinuities, such as those that may arise due to the previously-described operation of recirculating delay-locked loop 12. Summing unit 21 receives ideal clock 23 and output clock 26 and generates input phase signal 27 for reception by infinite impulse response filter 14. As described in conjunction with FIGS. 2B and 2C, the present invention contemplates operating directly upon output clock signal 26 to produce the effect of an infinite impulse filter, such as infinite impulse response filter 14, without necessarily converting output clock signal 26 into a phase signal for operation upon by infinite impulse filter 14.

Similarly, output phase signal 29 of infinite impulse response filter 14 is a phase signal and output clock signal 28 is a clock signal. A phase-to-time converter 32 converts output phase signal 29 to output clock signal 28. Also described in greater detail below, the present invention contemplates converting output clock signal 26 into output clock signal 28 without necessarily converting output clock signal 26 to a phase signal 27, filtering phase signal 27 to produce an output phase signal 29, and converting output phase signal 29 to a time signal 28.

Figure 2A:
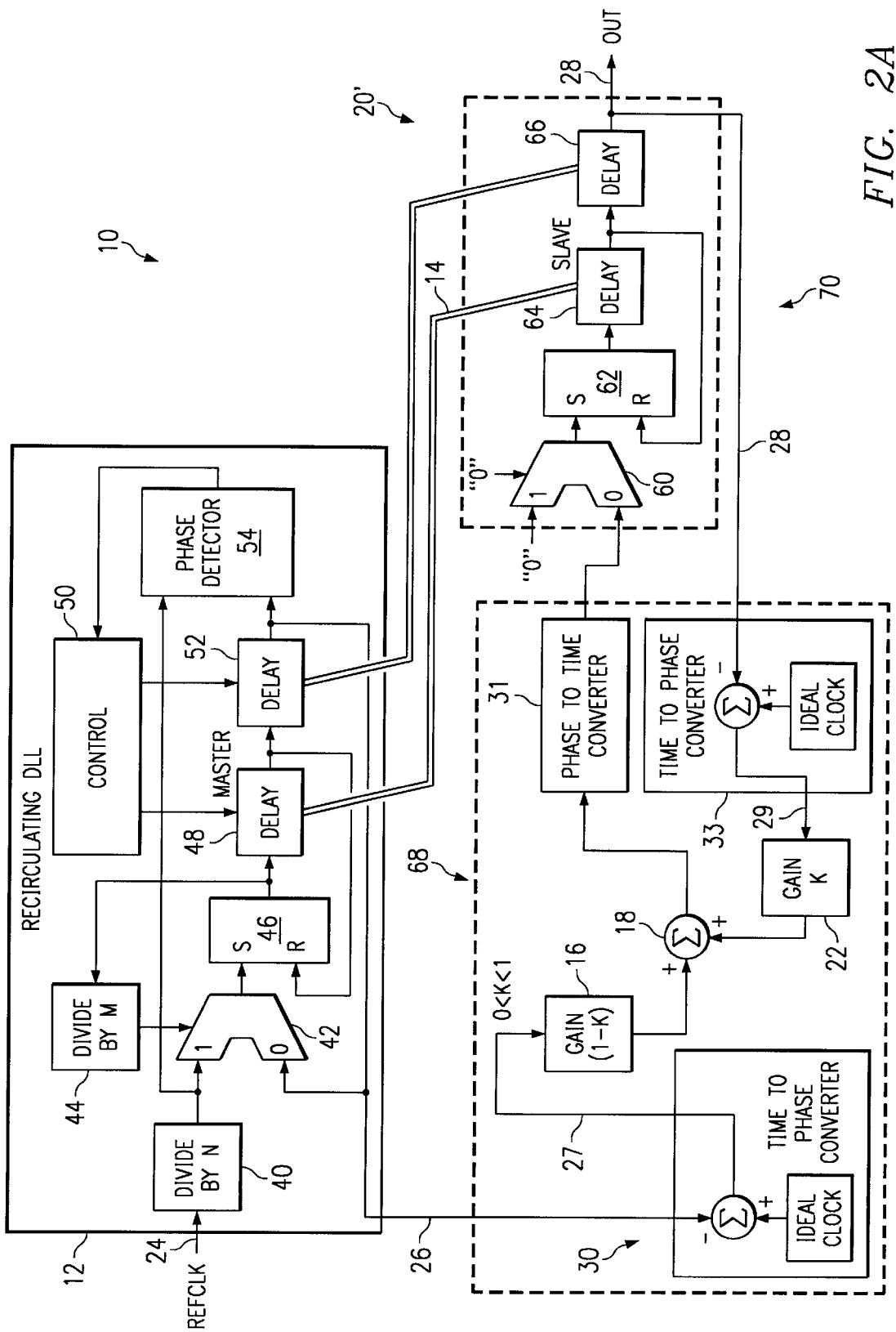
FIG. 2A is a block diagram further illustrating the concept of a post-filtered recirculating delay-locked loop, showing additional details of the recirculating delay-locked loop illustrated in FIG. 1 and an infinite impulse response filter illustrated in FIG. 1.

FIG. 2A is a block diagram illustrating post-filtered recirculating delay-locked loop 10 illustrated in FIG. 1, showing additional details of recirculating delay-locked loop 12 and infinite impulse response filter 14 illustrated in FIG. 1. As illustrated, recirculating delay-locked loop 10 includes a divider 40, a multiplexer 42, a second divider 44, a latch 46, a first delay unit 48, a control unit 50, a second delay unit 52, and a phase detector 54.

Divider 40 receives input clock signal 24 and divides the frequency of the input clock signal 24 by the integer n to result in an output that has 1/nth the frequency of input clock signal 24. This output is provided as one input to multiplexer 42. Multiplexer 42 provides either the output of divider 44 or zero to the set input of latch 46. Assuming an initial state of "1" for the output of divider 44 into latch 42, a rising edge received from divider 40 by multiplexer 42 provides a rising edge to set latch 46 and provide a rising edge to delay unit 48. Delay unit 48 delays its input for a set time period. The output of delay unit 48 is received by the reset input to latch 46 after a delay period of $\tau$. This input resets latch 46 so that the input to delay unit 48 and divider 44 is set low. The output of delay unit 48 is also received by delay unit 52.

After a delay period of $2\tau$, multiplexer 42 receives at a second input a "1", from the output of delay unit 52, for setting the output of latch 46 to a high level for providing to delay unit 48. This process occurs during m cycles that are counted by divider 44. After m cycles, the output of divider 40 again changes to high. This rising edge aligns the output of divider 40 with a rising edge for the output of latch 46.

Recirculating delay-locked loop 14 utilizes delay units 48 and 52 to delay output signal 26 a total of one clock cycle such that output clock signal 26 and reference clock signal 24 are in phase. Phase detector 54 cooperates with control unit 50 to adjust delay units 48 and 52 to provide appropriate delays such that output clock signal 26 lags the output of latch 46 for one period of output clock signal 26. However, until phase detector 54 and control unit 50 are able to adjust the delay provided by delay units 48 and 52, recirculating delay-locked loop 14 aligns the rising edges of the output of divider 40 with the rising edge for the output of latch 46 by delaying the output of latch 46, which also delays output clock signal 26. Additional detail on the operation of recirculating delay-locked loop 12 may be found in A Portable Clock Multiplier Generator Using Digital CMOS Standard Cells, cited above.

By delaying the rising edge of the output of latch 46 such that it coincides with the rising edge of input clock 24, a discontinuity in the phase of output clock signal 26 occurs once every clock period of reference clock 24 before recirculating delay-locked loop 12 has "locked" output clock signal 26 with reference clock signal 24. Thus, a discontinuity in the frequency of output clock signal 26 occurs once every clock signal of reference clock 24. If this discontinuity is too large, this may result in problems with circuitry utilizing output clock signal 26. To avoid such problems, output clock signal 26 is filtered by infinite impulse response filter 14.

As described above, infinite impulse response filter 14 generates an output clock signal 28 that, rather than adjusting the phase of output clock signal 26 in one cycle, gradually adjusts the phase of output clock signal 26 over a number of cycles to prevent significant phase deviations. One example of the combination of time-to-phase converter 30, infinite impulse response filter 14, and phase-to-time converter 32 is illustrated in FIG. 2A as system 70. System 70 includes a summation and gain unit 68 and a delay system 20'. Delay system 20' delays its input for one clock cycle of output clock cycle 20. Delay system 20' includes a multiplexer 60, a latch 62, a first delay unit 64, and a second delay unit 66. The operation of delay unit 20' is described in conjunction with FIG. 2B.

Summation and gain unit 68 includes time-to-phase converter 30, a phase-to-time converter 31, and a time-to-phase converter 33. Phase-to-time converter 31 is analogous to phase-to-time converter 32, and time-to-phase converter 33 is analogous to time-to-phase converter 30. Summation and gain unit 68 is a conceptual representation of time-to-phase converter 30, infinite impulse response filter 14, and phase-to-time converter 32. An actual implementation of the functions provided by these systems is illustrated in FIG. 2B.

Figure 2B:
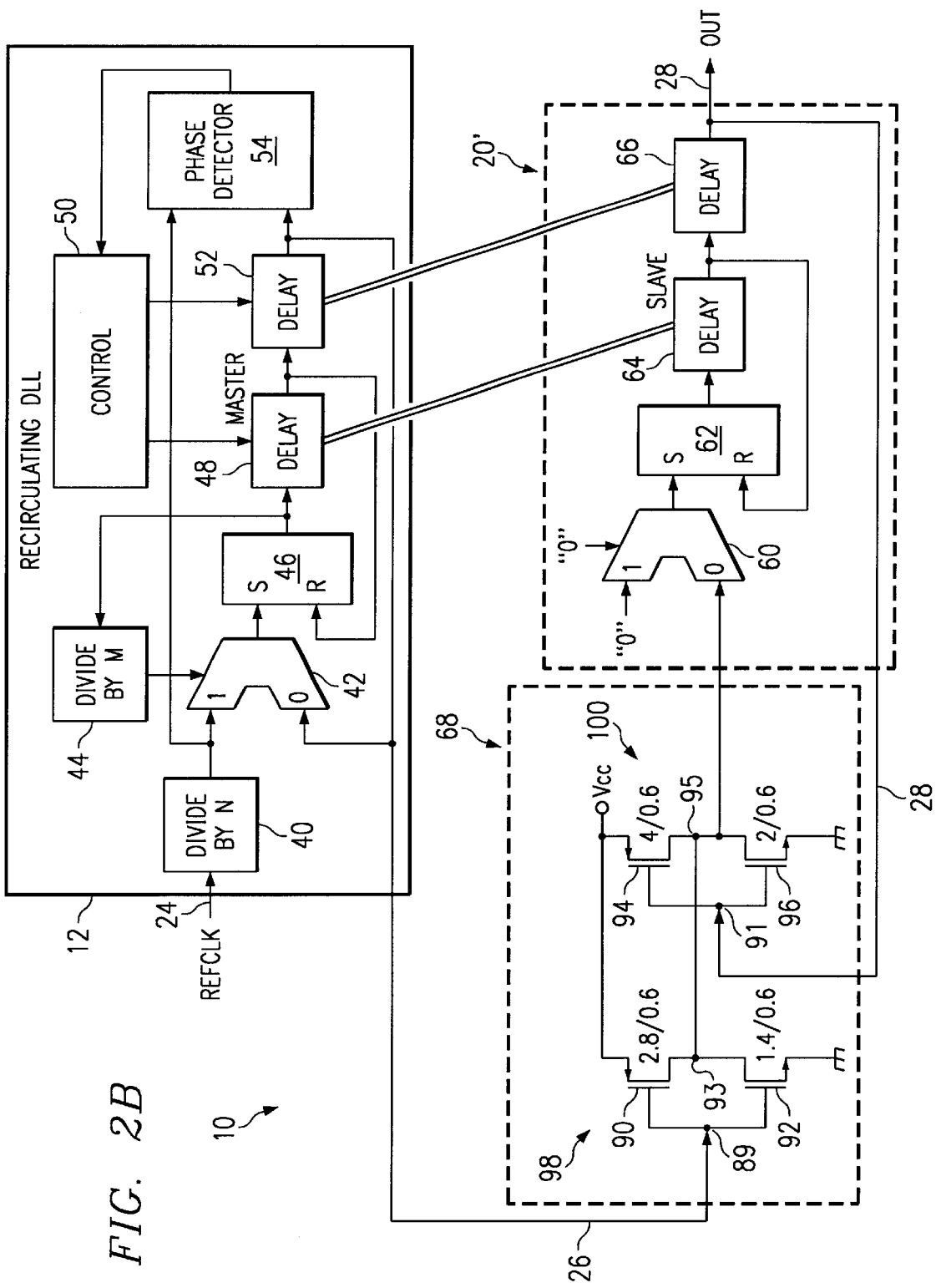
FIG. 2B is a block diagram illustrating an example implementation of a post-filtered recirculating delay-locked loop according to one embodiment of the invention.

FIG. 2B is a block diagram illustrating post-filtered recirculating delay-locked loop according to one embodiment of the present invention. In this embodiment, summation and gain unit 68 includes a pair of invertors 98 and 100 having output nodes 93 and 95 connected together. Inverter 98 includes a p-channel field-effect transistor 90 and an n-channel field-effect transistor 92; however, other suitable types of devices may be used. Inverter 100 includes a p-channel field effect transistor 94 and an n-channel field effect transistor 26; however, other suitable types of devices may be used. The drains of transistors 90 and 92 are connected to form output node 93 of inverter 98, and the drains of transistors 94 and 96 are connected to form output node 95 of inverter 100. The gates of transistors 90 and 92 each receive output clock signal 26 as an input. Transistors 94 and 96 each receive clock output signal 28 at their gates as an input. Delay unit 20' receives a voltage at output node 93, 95 as an input. As illustrated, transistor 90 has a width-to-length ratio of 2.8/0.6 and transistor 92 has a width-to-length ratio of 1.4/0.6. Transistor 94 has a width-to-length ratio of 4/0.6 and transistor 96 has a width-to-length ratio of 2/0.6. The width-to-length ratios of transistors 90, 92, 94, and 96 determine the gains of invertors 98 and 100. Although a particular configuration for invertors 98 and 100 has been shown, other suitable configurations may be implemented, including alternative gains for transistors 90, 92, 94, and 96.

The operation of summation and gain unit 68 is as follows. If output clock signal 26 and output clock signal 28 arrive at input nodes 89 and 91 simultaneously, summation and gain unit 68 performs as a single inverter. Thus, if output clock signals 26 and 28 are both high, transistors 90 and 94 will turn off because they are PMOS devices and have a zero gate-to-source voltage. Conversely, transistors 92 and 96 will turn on because they are NMOS devices and have a positive gate-to-source voltage. Thus, no current will flow through either inverter 98 or inverter 100 because transistors 92 and 96 are turned off. However, output nodes 93 and 95 will begin to discharge from a high voltage to a low voltage and will eventually assume a low voltage. Thus, invertors 98 and 100 will produce a low output voltage at nodes 93 and 95 when input nodes 89 and 91 receive a high voltage.

Conversely, if output clock signal 26 and output clock signal 28 arrive at input nodes 89 and 91 simultaneously, and are both low, transistors 90 and 94 will turn on because they are PMOS devices and have a negative gate-to-source voltage. In addition, transistors 92 and 96 will turn off because they are NMOS devices and have a zero gate-to-source voltage. Thus, no current will flow through either inverter 98 or inverter 100 because transistors 90 and 94 are turned off. However, output nodes 93 and 95 will begin to charge from a low voltage to a high voltage. Thus, invertors 98 and 100 will produce a high output voltage at nodes 93 and 95 when input nodes 89 and 91 receive a low voltage.

If however, output clock signal 26 and output clock signal 28 do not arrive simultaneously, inverters 98 and 100 will operate to produce an output voltage at nodes 93 and 95 that either delay or speed up output clock signal 28 such that a step transition in phase of output clock signal 26, such as a phase discontinuity provided by recirculating delay-locked loop 12, may be smoothed out over a number of clock cycles and output clock signal 26 and output clock signal 28 are aligned. If output clock signal 28 arrives at input node 91 before output clock signal 26 arrives at input node 89, and assuming a high value at output clock signal 28, transistor 94 will turn off and transistor 96 will turn on. Turning transistor 94 off and transistor 96 on results in discharging of output voltage 95 from a high value to a low value. However, because output clock signal 28 arrived before output clock signal 26, transistor 90 remains on and transistor 92 remains off. Therefore, a discharging at node 95 to a low value is delayed somewhat because node 93 is charged to a high value due to transistor 90 being on. Once output clock signal 26 arrives at input node 89, and has a high value, transistor 90 is turned off, transistor 92 is turned on and output node 93 discharges from a high value to a low value. Because discharging of nodes 93 and 95 from a high value to a low value is delayed, output clock signal 28 is delayed with respect to output clock signal 26.

Conversely, if a transition from low to high on output clock signal 28 arrives at node 91 after a transition from low to high on output clock signal 26 arrives at node 89, output clock signal 28 will be accelerated with respect to output clock signal 26. Because a transition from low to high of clock signal 26 arrives at input node 89 before a transition from low to high of clock signal 28 arrives at input node 91, node 93 begins to discharge before transistor 94 is turned off. Therefore, nodes 93 and 95 discharge to a low value quicker than would occur if nodes 93 and 95 do not begin to discharge until transistor 94 turned off. Thus, because the voltage at output nodes transitions faster than would otherwise occur, output clock signal 28 is accelerated with respect to output clock signal 26.

The output voltage at nodes 93 and 95 are received by delay unit 20'. Delay unit 20' delays the voltage at nodes 93 and 95 for a time period equal to the delay applied by multiplexer 42, latch 46, delay unit 48, and delay unit 52 described above. Delay unit 20' produces an output 28 that is provided as an output clock signal as well as fed back into node 91 of inverter 100. Thus, inverter 100 receives as an input at node 91 a value for clock signal 28 that is one time period delayed, which corresponds to delay unit 20 in infinite impulse response filter 14. For each transition from low to high of clock signal 28, summation and gain unit 68 operates to delay or speed up the output voltage at nodes 93 and 95 such that output clock signals 26 and 28 are progressively closer to being in phase. Thus, if recirculating delay-locked loop 12 produces a step transition in phase of clock signal 26, summation and gain unit 68 and delay unit 201 operate as an infinite impulse response filter of the phase of output clock signal 26 to produce an output clock signal 28 that spreads the effect of a step change in phase of output clock signal 26 over a number of clock cycles to produce an output clock signal 28.

Figure 2C:
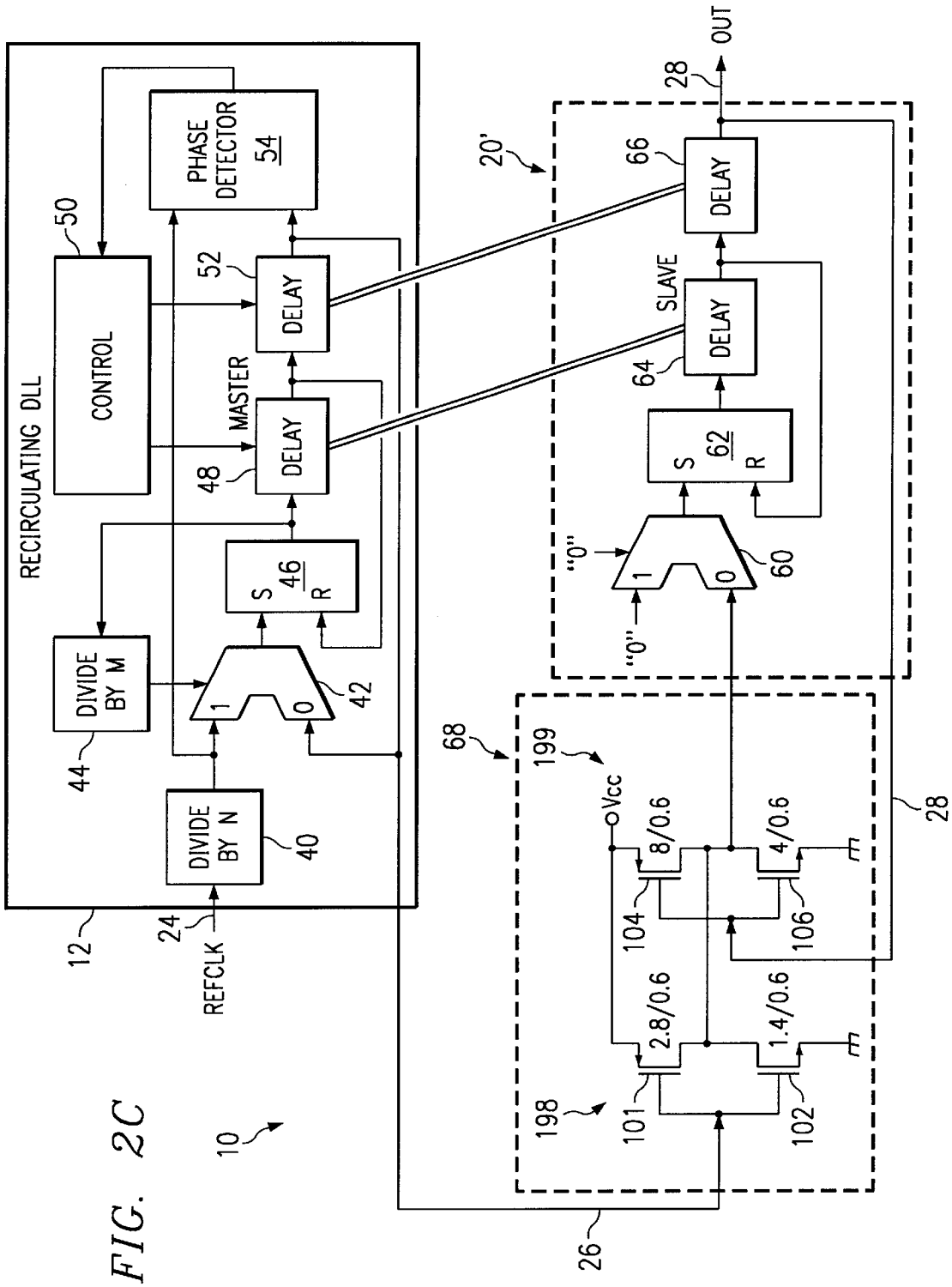
FIG. 2C is a block diagram illustrating another example of an implementation of a post-filtered recirculating delay-locked loop according to another embodiment of the present invention.

FIG. 2C is a block diagram illustrating a post-filtered recirculating delay-locked loop according to another embodiment of the present invention. The post-filtered recirculating delay-locked loop 310 illustrated in FIG. 2C is analogous to post-filtered recirculating delay-locked loop 210 illustrated in FIG. 2B except that the gains of transistors 101, 102, 104, and 106 in summation and gain unit 168 are modified. As illustrated, transistor 104 has a width-to-length ratio of 8/0.6, transistor 106 has a width-to-length ratio of 4/0.6, transistor 101 has a width-to-length ratio of 2.8/0.6 and transistor 102 has a width-to-length ratio of 1.4/0.6. Thus, inverter 199 has a relative strength greater than inverter 198 and inverter 98. Because inverter 199 receives its input from output clock signal 28, the configuration of summation and gain unit 168 corresponds to an infinite impulse response filter 14 having a value of K that is greater than the value of K for summation and gain unit 68. The effect of varying the value of K on recirculating delay-locked loops 210 and 310 are illustrated in FIG. 3.

Figure 3:
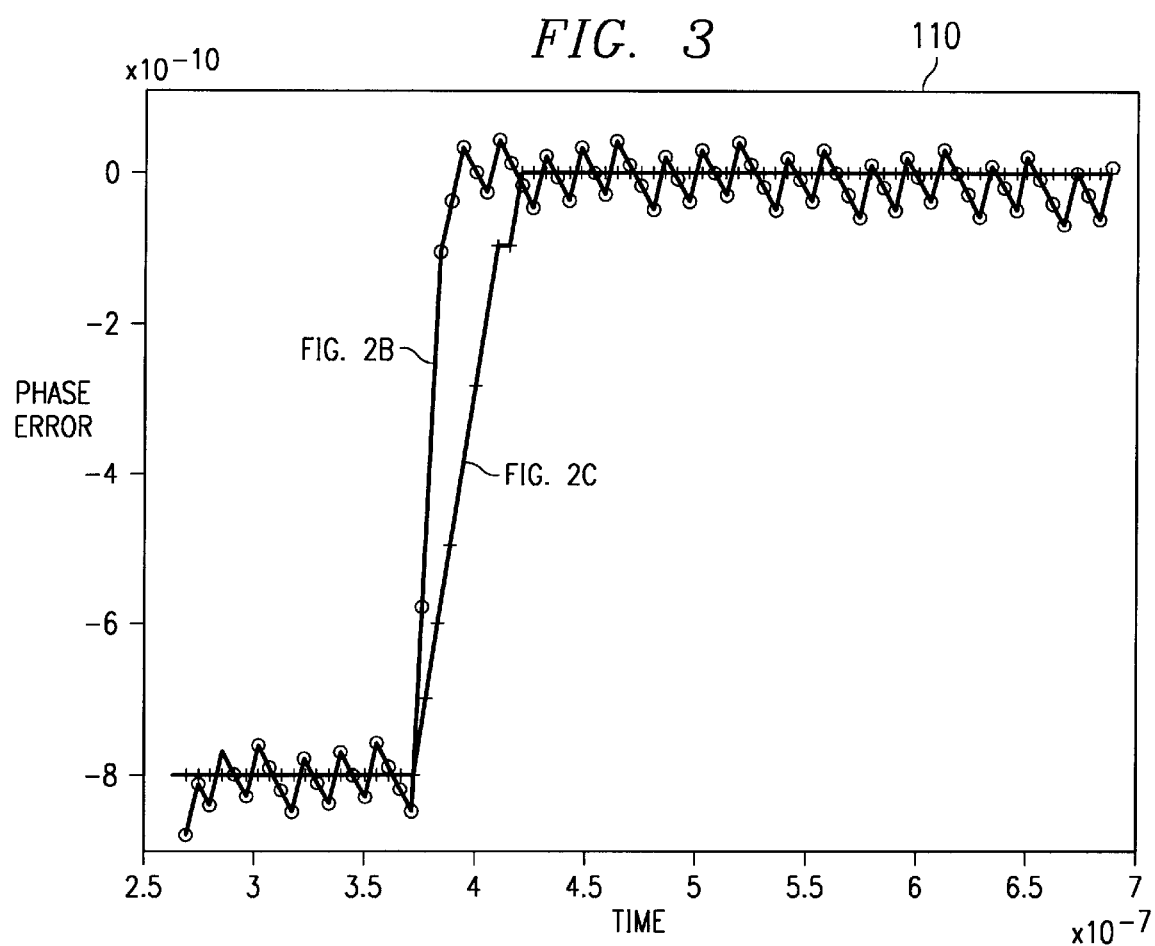
FIG. 3A is a graph illustrating jitter characteristics of a conventional recirculating delay-locked loop not incorporating the teachings of the present invention.
FIG. 3B is a graph of jitter characteristics of a post-filtered recirculating delay-locked loop according to the teachings of the present invention.

FIG. 3 is a graph 110 of phase error versus time illustrating the effect of changing the amount of feedback in summation and gain units 68 and 168 of FIGS. 2B and 2C. The curve marked FIG. 2B in FIG. 3 illustrates a fairly rapid transition in phase error for output signal 28 that occurs over approximately three cycles of output clock signal 28. In contrast, the curve labeled FIG. 2C in FIG. 3 illustrates a more gradual change in phase error over approximately seven cycles of output clock signal 28. The more gradual shift in phase error illustrated by the curve labeled FIG. 2C corresponds to summation and gain unit 168 having a greater amount of feedback than summation and gain unit 68.

Figure 4:
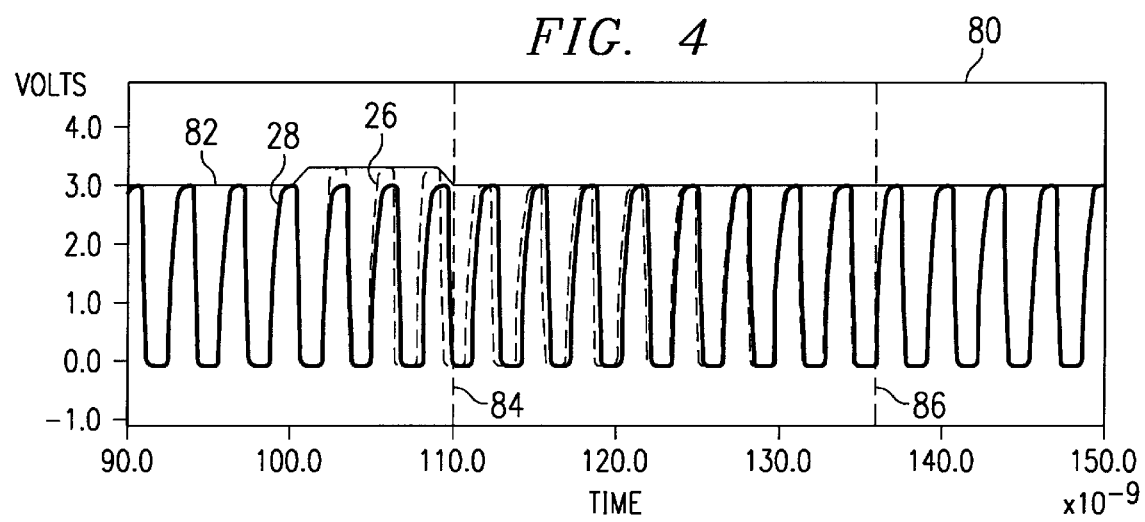
FIG. 4 is a graph of voltage versus time illustrating the introduction of a phase discontinuity and the absorption of this discontinuity over time according to the teachings of the present invention.

FIG. 4 is a graph 80 of voltage versus time for output clock signal 26 and output clock signal 28 illustrating the introduction of a phase discontinuity in output clock signal 26 and the absorption of this discontinuity with time according to the teachings of the present invention. The curve having a reference numeral of 82 represents a power supply for output clock signal 26. As illustrated, at approximately 100 nanoseconds a disturbance is introduced into curve 28 to cause a phase disturbance in output clock signal 26. Such a disturbance corresponds to a phase disturbance resulting from recirculating delay-locked loop 12. At approximately 110 nanoseconds, denoted by reference numeral 84, output clock signal 28 beings to slowly drift back into phase with output clock signal 26, thus delaying a sudden shift in phase of output clock signal 26 to produce output clock signal 28 with a more gradual adjustment in phase. Output clock signal 26 and output clock signal 28 are substantially aligned at approximately 136 nanoseconds, denoted by reference numeral 86.

FIG. 5A is a graph illustrating jitter in the phase error of output clock signal 26 with respect to an ideal clock. FIG. 5B is a graph of jitter of the phase error of output check signal 28 with respect to an ideal clock. As illustrated in FIG. 3A, the phase error of output clock signal 26 with respect to an ideal clock has random noise of varying magnitude. However, at the line denoted by reference numeral 400 a significant step phase error occurs from approximately $2.5 \times 10^{-10}$ to $-0.5 \times 10^{-10}$. Such a large jump in phase error of output clock signal 26 may be attributed to a recirculating delay-locked loop 12 generating a step phase shift for each clock cycle of reference clock 24. A similar jump in phase error is illustrated near reference line 410. In contrast, output signal 28 does not include large jumps in phase error because summation and gain unit 68 and delay unit 20' smooth out step changes in phase to produce a gradual transition of phase error both at reference line 500 and at reference line 510, illustrated in FIG. 5B.

Figure 6:
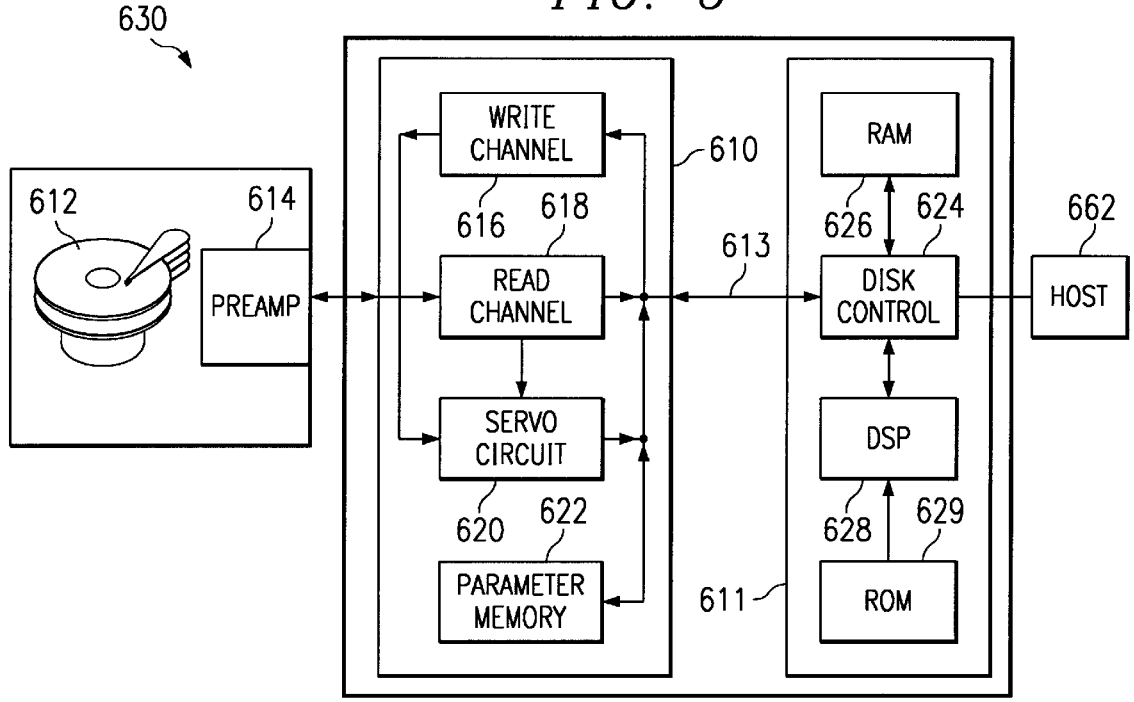
FIG. 6 is a block diagram of a disk drive mass storage system incorporating a post-filtered recirculating delay-locked loop according to one embodiment of the invention.
Figure 7:
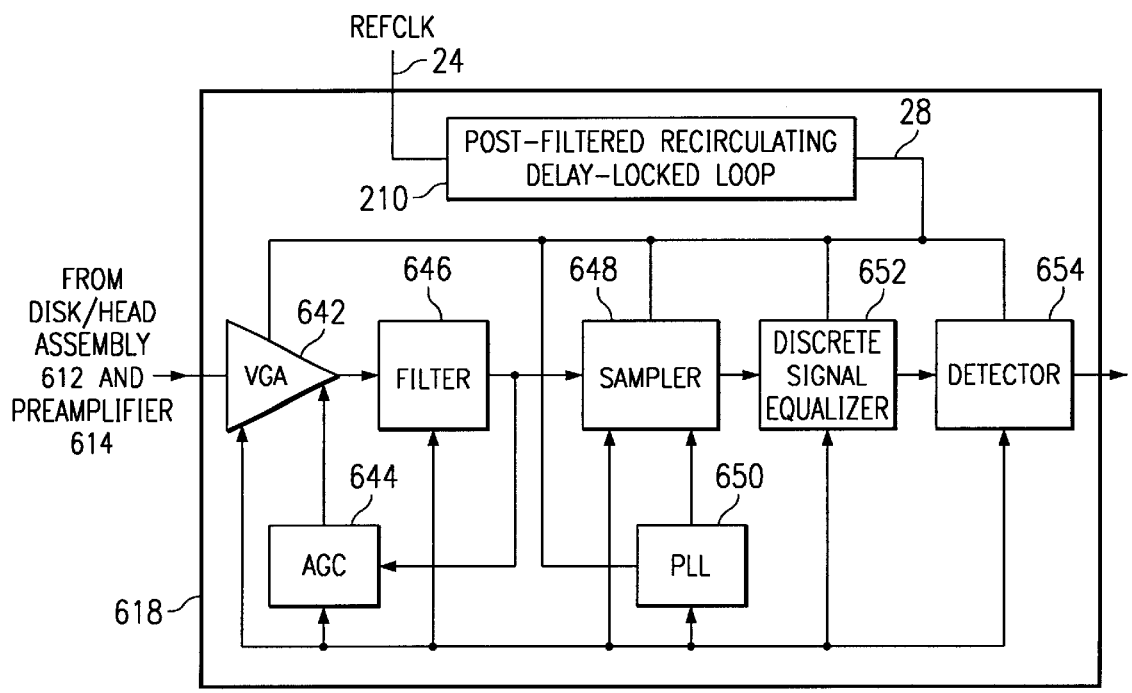
FIG. 7 is block diagram illustrating the read channel of the hard disk drive illustrated in FIG. 6 incorporating a post-filtered recirculating delay-locked loop according to one embodiment of the invention.

A post-filtered recirculating delay-locked loop according to the teachings of the invention, such as post filtered recirculating delay-locked loop 210, may be incorporated in numerous applications. One application for which such a post-filtered recirculating delay-locked loop is particularly suited is as a time-base generator in a disk drive mass storage system. For example, such a time-base generator may be formed on a read channel of a disk drive mass storage system. FIGS. 6 and 7 illustrate an example use of a post-filtered recirculating delay-locked loop according to the teachings the present invention as a time-base generator in a disk drive mass storage system.

FIG. 6 is a block diagram of a disk drive mass storage system 630 which is used for retrieving data during read operations and for storing data during write operations. Disk drive mass storage system 630 interfaces with a host 632 to exchange digital data during both read and write operations. Disk drive mass storage system 630 includes a disk/head assembly 612, a preamplifier 614, a synchronously sampled data (SSD) channel 610, and a control circuitry 611. Disk/head assembly 612 and preamplifier 614 are used to magnetically store data. SSD channel 610 and control circuitry 611 are used to process data that is being exchanged with disk/head assembly 612 and to control the various operations of disk drive mass storage system 630. Host 632 exchanges digital data with disk drive mass storage system 630 through control circuitry 611.

Disk/head assembly 612 includes a number of rotating magnetic disks or platters used to store data that is represented as magnetic transitions on the magnetic platters. The read/write heads of disk/head assembly 612 are used to store and retrieve data from each side of the magnetic platters. The read/write heads may be any number of available read/write heads such as magneto-resistive heads. Preamplifier 614 interfaces between the read/write heads of disk/head assembly 612 and SSD channel 610 and provides amplification to the analog data signals as needed.

SSD channel 610 is used during read and write operations to exchange analog data signals with disk/head assembly 612 and to exchange digital data signals with control circuitry 611 through a data/parameter path 613. SSD channel 610 includes a write channel 616, a read channel 618, a servo circuit 620, and a parameter memory 622. SSD channel 610 may be implemented as a single integrated circuit or as multiple integrated circuits.

During write operations, write channel 616 receives digital data from control circuitry 611 in parallel format through data/parameter path 613. The digital data is encoded for storage and provided to disk/head assembly 612. Write channel 616 may include a register, a scrambler, an encoder, a precoder, a serializer, and a write precompensation circuit. The operation and timing of write channel 616 is controlled by a phase locked loop system.

During read operations, read channel 618 receives analog data signals from disk/head assembly 612 through preamplifier 614. Read channel 618 conditions, detects, decodes, and formats the analog data signal and ultimately provides a corresponding digital data signal in parallel format to control circuitry 611 through data/parameter path 613. Read channel 618 is described in greater detail in conjunction with FIG. 7.

Control circuitry 611 is used to control the various operations of disk drive mass storage system 630 and to exchange digital data with SSD channel 610 and host 632. Control circuitry 611 includes a microprocessor 628, which may be implemented as a digital signal processor (DSP), a disk control 624, a random-access memory (RAM) 626, and a read-only memory (ROM) 629. Microprocessor 628, disk control 624, RAM 626, and ROM 629 together provide control and logic functions to disk drive mass storage system 630 so that data may be received from host 632, stored, and later retrieved and provided back to host 632. ROM 629 stores preloaded microprocessor instructions for use by microprocessor 628 in operating and controlling disk drive mass storage system 630. ROM 629 may also store the operational parameters that are supplied to parameter memory 622 during start-up. RAM 626 is used for storing digital data for write operations and for storing digital data that has been generated as a result of a read operation. Disk control 624 includes various logic and bus arbitration circuitry used to properly interface disk drive mass storage system 630 to host 632 and for internally interfacing control circuitry 611 to SSD channel 610. Depending on the circuit implementation, any of a variety of circuitry may be used in disk control 624. Control circuitry 611 is also responsible for generating the various control and enable signals of disk drive mass storage system 630.

FIG. 7 is block diagram illustrating one example of read channel 618 incorporating post-filtered recirculating delay-locked loop 210 according to one embodiment of the invention. It should be noted that the implementation of read channel 618, as illustrated in FIG. 7, is only one embodiment of a read channel and that the present invention is not limited to any one particular type or arrangement of read channel.

Read channel 618, in the one embodiment of FIG. 7, includes a variable gain amplifier (VGA) 642, an automatic gain control circuit (AGC) 644, a filter 646, a sampler 648, a phase locked loop (PLL) 650, a discrete signal equalizer 652, a detector 654, and recirculating delay-locked loop 210 serving as a time-base generator for read channel 618. Each of these portions of read channel 618 cooperate to receive and process a read signal from preamplifier 614 and disk/head assembly 612 during a read operation and generate an outbound digital data signal in response.

Read channel 618 receives the read signal at VGA 642 where the signal is amplified by an amount that is controlled by AGC 644 to generate an amplified read signal. VGA 642, along with AGC 644, work together to provide an appropriate amplification or gain to the analog read signal. AGC 644 receives a feedback signal from the output of filter 646 so that appropriate adjustments can be made in the amplification or gain provided to the read signal by VGA 642.

The amplified read signal is then provided by VGA 640 to filter 646 for further processing. Filter 646, in one embodiment, filters the signal to remove unwanted high frequency noise and thus is implemented as a low pass filter. Filter 646 may also provide waveform shaping with amplitude boost. For example, filter 646 may be a continuous-time 7th order filter designed using Gm/C components. The cutoff frequency and boost of filter 646 may be programmable. The filtered read signal of filter 646 is provided to sampler 648.

Sampler 648 samples the filtered read signal from filter 646 and generates a discrete read signal having discrete values. Sampler 648 converts the filtered read signal from continuous-time to discrete-time. The filtered read signal is sampled synchronously at times that correspond to the various magnetic transitions stored on the magnetic or storage media of disk/head assembly 612. These magnetic transitions correspond to the data stored on disk/head assembly 612. Sampler 648 samples the signal and holds the value until the next sample occurs.

PLL 650 provides a sampling clock or signal to sampler 648 that controls when sampler 648 samples and holds the filtered read signal. Each discrete value of the discrete read signal corresponds to the value or amplitude of the filtered read signal at the time the signal is sampled by sampler 648. Sampler 648 may be implemented as a sample and hold circuit such as a circular sample and hold circuit that is time sequence multiplexed to discrete signal equalizer 652 so that the correct time sequenced value is presented to discrete signal equalizer 652.

Discrete signal equalizer 652 receives the discrete read signal from sampler 648 and generates an equalized read signal having discrete levels corresponding to the magnetic transitions on disk/head assembly 612. Discrete signal equalizer 652 may be implemented as an analog finite impulse response filter. The discrete read signal is equalized to the target function of detector 654.

Detector 654 receives the discrete read signal from discrete signal equalizer 652. Detector 654 analyzes the signal and generates the outbound digital signal corresponding to the data stored on disk/head assembly 614. In one embodiment, detector 654 may be a maximum likelihood detector or Viterbi detector implementing the Viterbi algorithm. Although not illustrated in FIG. 7, read channel 618 may also include a synchronization detection circuit and a deserializer to properly interface the outbound digital signal with bus 622.

Variable gain amplifier 640, sampler 648, discrete signal analyzer 652, detector 654, and PLL 650 each require a clock signal to function appropriately. As illustrated in FIG. 7, according to the invention, VGA 640, sampler 648, discrete signal analyzer 652, detector 654, and PLL 650 each receive a clock signal from post-filtered recirculating delay-locked loop 210. Because post-filtered recirculting delay-locked loop 210 produces an output signal, such as output signal 28, that does not include abrupt phase shifts, but rather spreads any phase shift out over several cycles, the devices operating in read channel 630 may operate with less disturbance than conventional mass storage devices.

Although the present invention and its advantages have been described in detail, it should be understood that various changes, substitutions, and alterations can be made therein without departing from the spirit and scope of the present invention as defined by the appended claims.

What is claimed is:

1. An apparatus for producing a clock signal comprising:
   a recirculating delay-locked loop operable to receive a reference clock signal, produce an output clock signal, and adjust the relative phase, with respect to the reference clock signal, of the output clock signal to align the output clock signal with the reference clock signal; and
   a phase filter operable to receive the output clock signal and filter any phase shift of the output clock signal over a plurality of cycles of the output clock to produce an adjusted output clock signal, wherein the phase filter comprises:
      a summation and gain unit operable to receive the output clock signal and a feedback clock signal and generate an intermediate adjusted output clock signal; and
      a delay unit operable to receive the intermediate adjusted output clock signal and delay the intermediate adjusted output clock signal to produce the adjusted clock signal.

2. An apparatus for producing a clock signal comprising:
   a recirculating delay-locked loop operable to receive a reference clock signal, produce an output clock signal, and adjust the relative phase, with respect to the reference clock signal, of the output clock signal to align the output clock signal with the reference clock signal; and
   a phase filter operable to receive the output clock signal and filter any phase shift of the output clock signal over a plurality of cycles of the output clock to produce an adjusted output clock signal, wherein the phase filter comprises:
      a first inverter having an input and an output, the input operable to receive the output clock signal;
      a second inverter having an input and an output, the input of the second inverter operable to receive the adjusted output clock signal; and
      wherein the output of the first inverter and the output of the second inverter are connected together and generate the intermediate output clock signal.

3. The apparatus of claim 1, wherein the delay unit is operable to delay the intermediate adjusted output clock signal by one period of the intermediate adjusted output clock signal to produce the adjusted output clock signal.

4. An apparatus for producing a clock signal comprising:
   a recirculating delay-locked loop operable to receive a reference clock signal, produce an output clock signal, and adjust the relative phase, with respect to the reference clock signal, of the output clock signal to align the output clock signal with the reference clock signal; and
   a phase filter operable to receive the output clock signal and filter any phase shift of the output clock signal over a plurality of cycles of the output clock to produce an adjusted output clock signal, wherein the recirculating delay-locked loop comprises:
   a phase comparator for comparing the phase of a reference clock signal to the phase of the output clock signal;
   a pair of variable delay elements operable to delay a received signal; and
   a controller operable to control the delay of the delay elements based on the relative phase of the reference clock signal and the output clock signal and adjust the delay of the delay elements such that the reference clock signal and the output clock signal are aligned.

5. The apparatus of claim 4, wherein the phase filter comprises:
   a summation and gain unit operable to receive the output clock signal and the adjusted output clock signal and generate an intermediate adjusted output clock signal;
   a delay unit operable to receive the intermediate adjusted output clock signal and delay the intermediate adjusted output clock signal to produce the adjusted clock signal; and
   wherein the delay unit comprises a pair of delay units having the same delay as the variable delay elements.

6. The apparatus of claim 4, and further comprising a latch for delaying the output clock signal once every clock signal of the reference clock signal to align the output clock signal with the reference clock signal.

7. An apparatus for producing a clock signal comprising:
   a recirculating delay-locked loop operable to receive a reference clock signal, produce an output clock signal, and adjust the phase, with respect to the reference clock, of the output clock signal to align the output clock signal with the reference clock signal, the recirculating delay-locked loop comprising:

a phase comparator for comparing the relative phase of the reference clock signal with the output clock signal;

at least one delay element operable to delay a received signal; and a controller operable to control the delay of the at least one delay element based on the relative phase of the reference clock signal and the output clock signal and adjust the delay of the delay elements such that the reference clock signal and the output clock signal are aligned; and a phase filter operable to receive the output clock signal and filter any phase shift of the output clock signal over a plurality of cycles of the output clock signal to produce a filtered output clock signal, the phase filter comprising:

a summation and gain unit operable to receive the output clock signal and a feedback clock signal and generate an intermediate adjusted output clock signal; and a delay unit operable to receive the intermediate adjusted output clock signal and delay the intermediate adjusted output clock signal to produce an adjusted output clock signal.

8. The apparatus of claim 7, wherein the summation and gain unit comprises:

a first inverter having an input and an output, the input operable to receive the output clock signal;

a second inverter having an input and an output, the input of the second inverter operable to receive the adjusted output clock signal; and wherein the output of the first inverter and the output of the second inverter are connected together and generate the intermediate output clock signal.

9. The apparatus of claim 8, wherein the delay unit comprises at least one delay element having the same delay as the at least one delay element in the recirculating delay-locked loop.

10. The apparatus of claim 7, wherein the recirculating delay-locked loop further comprises a latch for delaying the output clock signal once every clock signal of the reference clock signal to align the output clock signal with the reference clock signal.

11. The apparatus of claim 10, wherein the recirculating delay-locked loop further comprises a divider cooperating with the phase comparator, at least one delay unit, latch, and controller such that the output signal has a frequency that is a multiple of the input signal.

12. An apparatus for producing a clock signal comprising:

a recirculating delay-locked loop operable to receive a reference clock signal, produce an output clock signal, and adjust the phase, with respect to the reference clock signal, of the output clock signal to align the output clock signal with the reference clock signal, the recirculating delay-locked loop comprising:

a phase comparator for comparing the relative phase of the reference clock signal with the output clock signal;

at least one delay element operable to delay a received signal; and a controller operable to control the delay of the at least one delay element based on the relative phase of the reference clock signal and the output clock signal and adjust the delay of the at least one delay element such that the reference clock signal and the output clock signal are aligned; and a phase filter operable to receive the output clock signal and filter any phase shift of the output clock signal over a plurality of cycles of the output clock signal to produce a filtered output clock signal, the phase filter comprising:

a summation and gain unit operable to receive the output clock signal and a feedback clock signal and generate an intermediate adjusted output clock signal; and a delay unit operable to receive the intermediate adjusted output clock signal and delay the intermediate adjusted output clock signal to produce an adjusted output clock signal;

wherein the summation and gain unit is operable to generate said intermediate adjusted output clock signal having a phase difference with respect to the output clock signal being less than any phase difference between the adjusted output clock signal and the feedback clock signal.

13. A method of generating a clock signal comprising:

receiving a clock signal from a recirculating delay-locked loop; and filtering a periodic output signal from the recirculating delay-locked loop such that any phase shift in the output signal of the recirculating delay-locked loop is spread over at least two periods of the output clock signal to produce a filtered output signal, wherein the step of filtering a periodic output signal comprises delaying, during each of a plurality of cycles of the periodic output signal, the periodic output signal for a time period having a magnitude being less than the magnitude of the phase shift to produce a filtered output signal.

14. A method of generating a clock signal comprising:

receiving an output clock signal from a recirculating delay-locked loop; and filtering a periodic output signal from the recirculating delay-locked loop such that any phase shift in the output clock signal of the recirculating delay-locked loop is spread over at least two periods of the output clock signal to produce a filtered output signal;

wherein the step of filtering a periodic output signal comprises delaying, during each of a plurality of cycles of the periodic output signal, the periodic output signal for a time period having a magnitude being less than the magnitude of the phase shift to produce a filtered output signal;

wherein the step of delaying the periodic output signal comprises delaying each of the plurality of cycles of the periodic output signal for a time period being successively shorter for each of the plurality of clock cycles and approaching zero to produce a filtered output signal.

15. A method of generating a clock signal comprising:

receiving an output clock signal from a recirculating delay-locked loop; and filtering a periodic output signal from the recirculating delay-locked loop such that any phase shift in the output clock signal of the recirculating delay-locked loop is spread over at least two periods of the output clock signal to produce a filtered output signal;

wherein the step of filtering a periodic output signal comprises accelerating the occurrence of each of a plurality of cycles of the periodic output signal for a time period having a magnitude less than a magnitude of the phase shift to produce a filtered output signal.

16. The method of claim 15, wherein the step of accelerating the occurrence of each of a plurality of cycles further comprises accelerating the occurrence of each of the plurality of cycles of the periodic output signal for a time period being successfully shorter for each of the plurality of clock cycles and approaching zero to produce a filtered output signal.

17. The method of claim 15, wherein the step of filtering a periodic output signal comprises the steps of:
   providing the periodic output signal to a first inverter having an output connected to an output of a second inverter; and
   providing a feedback signal indicative of a partially filtered output signal to the second inverter to produce the filtered output signal.

18. A mass storage disk drive comprising:
   a disk/head assembly operable to magnetically store data;
   a control circuitry operable to exchange digital data with a host; and
   a data channel operable to receive analog data signal from the disk/head assembly and exchange digital data signals with the control circuitry, the data channel comprising a read channel, the read channel operable to receive and process a read signal from the disk/head assembly during a read operation and to generate an outbound digital data signal in response, the read channel comprising a post-filtered recirculting delay-locked loop operable to produce an adjusted output clock signal for use by the read channel, the post-filtered recirculating delay-locked loop comprising:
      a recirculating delay-locked loop operable to receive a reference clock signal, produce an output clock signal, and adjust the relative phase, with respect to the reference clock signal, of the output clock signal to align the output clock signal with the reference clock signal; and
      a phase filter operable to receive the output clock signal and filter any phase shift of the output clock signal over a plurality of cycles of the output clock to produce the adjusted output clock signal.

19. The mass storage disk drive of claim 18, wherein the phase filter comprises:
   a summation and gain unit operable to receive the output clock signal and a feedback clock signal and generate an intermediate adjusted output clock signal; and
   a delay unit operable to receive the intermediate adjusted output clock signal and delay the intermediate adjusted output clock signal to produce the adjusted clock signal.

20. The mass storage disk drive of claim 18, wherein the phase filter comprises:
   a first inverter having an input and an output, the input operable to receive the output clock signal;
   a second inverter having an input and an output, the input of the second inverter operable to receive the adjusted output clock signal; and
   wherein the output of the first inverter and the output of the second inverter are connected together and generate the intermediate output clock signal.

21. The mass storage disk drive of claim 19, wherein the delay unit is operable to delay the intermediate adjusted output clock signal by one period of the intermediate adjusted output clock signal to produce the adjusted output clock signal.

22. The mass storage disk drive of claim 18, wherein the recirculating delay-locked loop comprises:
   a phase comparator for comparing the phase of a reference clock signal to the phase of the output clock signal;
   a pair of variable delay elements operable to delay a received signal; and
   a controller operable to control the delay of the delay elements based on the relative phase of the reference clock signal and the output clock signal and adjust the delay of the delay elements such that the reference clock signal and the output clock signal are aligned.

23. The mass storage disk drive of claim 22, wherein the phase filter comprises:
   a summation and gain unit operable to receive the output clock signal and the adjusted output clock signal and generate an intermediate adjusted output clock signal;
   a delay unit operable to receive the intermediate adjusted output clock signal and delay the intermediate adjusted output clock signal to produce the adjusted clock signal; and
   wherein the delay unit comprises a pair of delay units having the same delay as the variable delay elements.

24. The mass storage disk drive of claim 18, and further comprising a latch for delaying the output clock signal once every clock signal of the reference clock signal to align the output clock signal with the reference clock signal.

* * * * *